(12) United States Patent
Park et al.

(10) Patent No.: US 11,284,192 B2
(45) Date of Patent: Mar. 22, 2022

(54) SPEAKER DRIVER AND OPERATION METHOD THEREOF

(71) Applicant: IRON DEVICE CORPORATION, Seoul (KR)

(72) Inventors: Ki Tae Park, Seoul (KR); Jin Sung Kim, Seoul (KR); Kyu Don Choi, Hanam-si (KR); Hwang Soo Son, Cupertino, CA (US)

(73) Assignee: IRON DEVICE CORPORATION, Seoul (KR)

( * ) Notice: Subject to any disclaimer, the term of this patent is extended or adjusted under 35 U.S.C. 154(b) by 241 days.

(21) Appl. No.: 16/610,206

(22) PCT Filed: Jun. 15, 2018

(86) PCT No.: PCT/KR2018/006787
§ 371 (c)(1),
(2) Date: Nov. 1, 2019

(87) PCT Pub. No.: WO2019/235674
PCT Pub. Date: Dec. 12, 2019

(65) Prior Publication Data
US 2021/0337309 A1    Oct. 28, 2021

(30) Foreign Application Priority Data

Jun. 5, 2018   (KR) .......................... 10-2018-0064662

(51) Int. Cl.
*H02M 3/155*      (2006.01)
*H03F 3/183*      (2006.01)
(Continued)

(52) U.S. Cl.
CPC ............ *H04R 3/007* (2013.01); *H02M 3/155* (2013.01); *H03F 3/183* (2013.01); *H04R 17/00* (2013.01); *H03F 2200/03* (2013.01)

(58) Field of Classification Search
CPC .......... H04R 3/007; H04R 17/00; H04R 3/00; H02M 3/155; H02M 1/007; H02M 1/126;
(Continued)

(56) References Cited

U.S. PATENT DOCUMENTS

2009/0066412 A1    3/2009  Shimizu
2009/0147972 A1    6/2009  Hwang
(Continued)

FOREIGN PATENT DOCUMENTS

CN    101959100 A    1/2011
CN    103533485 A    1/2014
(Continued)

OTHER PUBLICATIONS

KR 2011011819 A, Feb. 9, 2011, Jung Y C et al.*
(Continued)

*Primary Examiner* — Paul Kim
*Assistant Examiner* — Friedrich Fahnert
(74) *Attorney, Agent, or Firm* — Osha Bergman Watanabe & Burton LLP

(57) ABSTRACT

The present invention relates to a speaker driver and an operation method thereof and includes an amp part configured to output a pulse voltage, in which an input signal is amplified on the basis of a supply voltage, to drive a capacitive speaker that generates sound by a driving voltage so that the driving voltage formed by filtering the pulse voltage is applied to the capacitive speaker, and a controller configured to adjust a magnitude of an input audio signal in a high frequency range and transmit the input audio signal to the amp part as the input signal to limit an overcurrent applied to the capacitive speaker by the driving voltage having a high frequency.

12 Claims, 10 Drawing Sheets

(51) Int. Cl.
*H04R 17/00* (2006.01)
*H04R 3/00* (2006.01)

(58) Field of Classification Search
CPC .. H02M 1/32; H02M 3/1588; H02M 7/53871; H03F 3/183; H03F 2200/03; H03F 3/217; H03F 3/2173; H03K 7/08
USPC .......................................................... 381/55
See application file for complete search history.

(56) References Cited

U.S. PATENT DOCUMENTS

| | | |
|---|---|---|
| 2011/0095817 A1 | 4/2011 | Yamada |
| 2013/0223651 A1 | 8/2013 | Hoyerby |

FOREIGN PATENT DOCUMENTS

| | | | |
|---|---|---|---|
| JP | 2002262576 A | | 9/2002 |
| JP | 2006-094148 A | | 4/2006 |
| JP | 2008-244554 A | | 10/2008 |
| JP | 2011-091642 A | | 5/2011 |
| JP | 2011130253 A | | 6/2011 |
| JP | 2012-235403 A | | 11/2012 |
| JP | 2012235403 A | * | 11/2012 |
| KR | 10-2006-0055642 A | | 5/2006 |
| KR | 10-2011-0011819 A | | 2/2011 |
| KR | 101018188 B1 | | 2/2011 |
| KR | 10-2013-0132456 A | | 12/2013 |

OTHER PUBLICATIONS

International Search Report issued in corresponding International Application No. PCT/KR2018/006787 dated Mar. 5, 2019 (3 pages).
Written Opinion issued in corresponding International Application No. PCT/KR2018/006787 dated Mar. 5, 2019 (7 pages).
Office Action issued in the corresponding Japanese Patent Application No. 2020-571320 dated Jul. 26, 2021 (4 pages).
Office Action issued in the corresponding Chinese Patent Application No. 201880035088.7 dated Oct. 10, 2020 (7 pages).

* cited by examiner

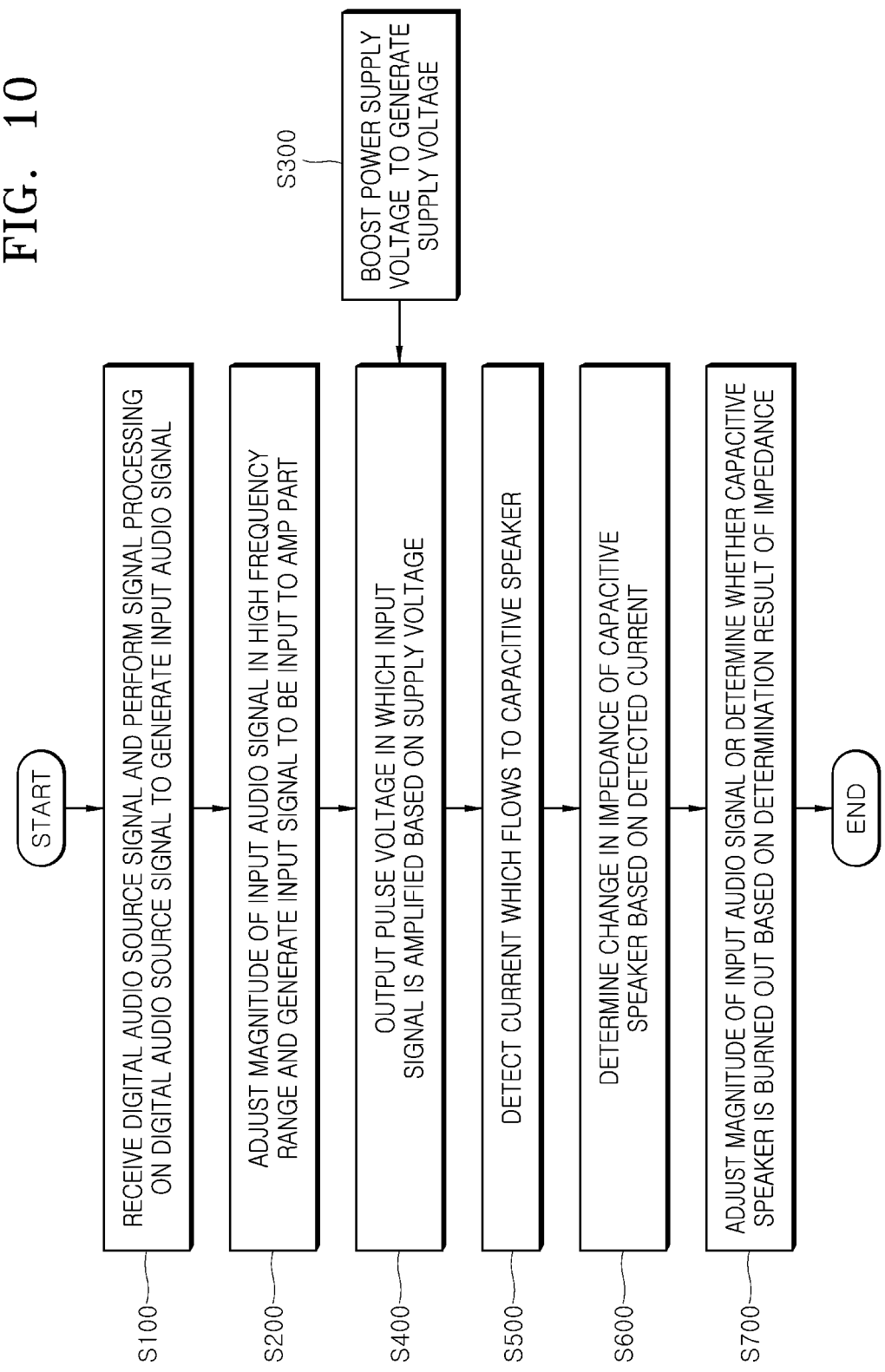

SPEAKER DRIVER AND OPERATION METHOD THEREOF

TECHNICAL FIELD

The present invention relates to speaker driver and an operation method thereof, and more specifically, to a speaker driver configured to drive a piezo speaker and an operation method thereof.

BACKGROUND ART

A piezoelectric effect refers to an effect in which dielectric polarization occurs and thus electricity is generated when a pressure or vibration is applied to a piezoelectric body (a direct piezoelectric effect), and an effect in which a vibration is generated when electricity is applied to a piezoelectric body (an inverse piezoelectric effect). A piezo speaker is a capacitive speaker configured to generate sounds as the piezoelectric effect is applied and thus displacement is generated by a voltage applied to both ends of the speaker and generally generates a greater sound pressure level at a greater frequency when the same AC voltage is applied.

Since the piezo speaker is capacitive load in a circuit, when the piezo speaker is driven by a driving voltage having a high frequency, impedance of the piezo speaker decreases and thus a current which flows to the piezo speaker suddenly increases. A method of inserting a serial resistor may be considered to limit an overcurrent which flows to the piezo speaker, but in this case, a great deal of heat is generated from the serial resistor by the overcurrent, and accordingly, power loss increases, and further, since a serial resistor having a large size is required to limit the overcurrent, minimization becomes difficult.

Meanwhile, a class-AB amplifier is generally used as an amplifier configured to drive the piezo speaker. As is well known, the energy efficiency of the class-AB amplifier is only 20% to 50%, heat is easily generated, and a volume thereof is large.

The background art of the present invention is disclosed in Korean Laid-Open Patent No, 10-2006-0055642 (published on May 24, 2006).

DISCLOSURE

Technical Problem

The present invention is directed to providing a speaker driver configured to limit an overcurrent generated when a piezo speaker is driven at a high frequency through a class-AB amplifier without using a serial resistor so as to remove problems in a conventional speaker driver such as heat generation, power loss, and an increase in volume and an operation method thereof.

Technical Solution

One aspect of the present invention provides a speaker driver including an amp part configured to output a pulse voltage, in which an input signal is amplified on the basis of a supply voltage, to drive a capacitive speaker that generates sound by a driving voltage so that the driving voltage formed by filtering the pulse voltage is applied to the capacitive speaker, and a controller configured to adjust a magnitude of an input audio signal in a high frequency range and transmit the input audio signal to the amp part as the input signal to limit an overcurrent applied to the capacitive speaker by the driving voltage having a high frequency.

In the present invention, the controller may perform signal processing on the input audio signal and attenuate the magnitude of the input audio signal in the high frequency range.

The present invention may further include an inductive element connected between the amp part and the capacitive speaker to form a low pass filter (LPF) together with the capacitive speaker and prevent a short current caused by the pulse voltage and the capacitive speaker.

In the present invention, the amp part may be a class-D amplifier including a pulse width modulator configured to perform pulse width modulation on the input signal to generate a pulse width modulation signal, and a switch part switched by the pulse width modulation signal to output the pulse voltage.

The present invention may further include a capacitor configured to generate the supply voltage supplied to the amp part, and a boost converter part configured to output a current from a power supply part to the capacitor so that the supply voltage in which a power supply voltage of the power supply part is boosted is formed in the capacitor.

In the present invention, the boost converter part may be a synchronous boost converter including a first boost switch switched to output the current from the power supply part to the capacitor or return the current from the capacitor to the power supply part, and a second boost switch which excites the current from the power supply part to ground and is complementarily switched with the first boost switch.

The present invention may further include an audio interface part configured to receive an audio source signal and perform signal processing on the audio source signal to generate the input audio signal and transmit the input audio signal to the controller, wherein the audio interface part may receive the audio source signal as a digital signal to prevent application of a switching noise caused by a switching operation of the amp part and a switching operation of the boost converter part to the audio source signal.

The present invention may further include a current detection part configured to detect a current which flows to the capacitive speaker, wherein the controller may determine a change in impedance of the capacitive speaker on the basis of the current detected by the current detection part and adjust the magnitude of the input audio signal or determine whether the capacitive speaker is burned out on the basis of a determination result.

In the present invention, the capacitive speaker may be a piezo speaker.

Another aspect of the present invention provides an operation method of a speaker driver including adjusting, by a controller, a magnitude of an input audio signal in a high frequency range and generating an input signal to be input to an amp part to limit an overcurrent applied to a capacitive speaker configured to generate sound by a driving voltage, and outputting, by the amp part, a pulse voltage in which the input signal is amplified on the basis of a supply voltage to drive the capacitive speaker and applying the driving voltage formed by filtering the pulse voltage to the capacitive speaker.

Advantageous Effects

According to one aspect of the present invention, the present invention can remove problems in a conventional speaker driver such as heat generation, power loss, and an increase in volume and improve energy efficiency by limiting an overcurrent generated when a piezo speaker is driven at a high frequency through a class-AB amplifier using predetermined signal processing instead of a serial resistor.

DESCRIPTION OF DRAWINGS

FIG. 10 is a flow chart illustrating an operation method of the speaker driver according to one embodiment of the present invention

MODES OF THE INVENTION

Figure 1:
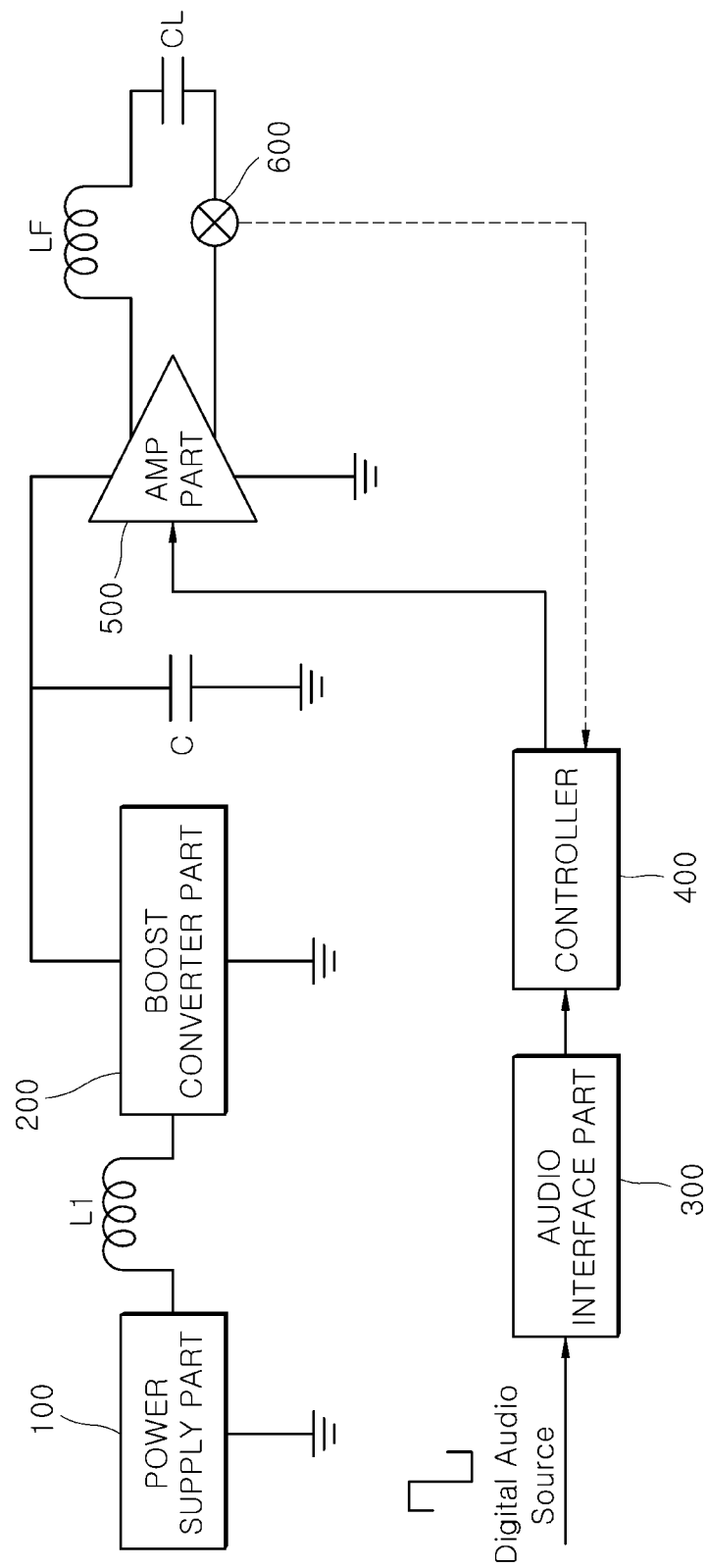
FIGS. 1 and 2 are exemplary views for describing an overall circuit configuration of a speaker driver according to one embodiment of the present invention.

Hereinafter, one embodiment of a speaker driver and an operation method thereof according to the present invention will be described with reference to the drawings. In this process, thicknesses of lines, sizes of elements, or the like shown in the drawings may be exaggerated for clarity and convenience of descriptions. Further, terms which will be described later are terms determined in consideration of functions in the present invention and may be changed according to intention or custom of a user or an operator. Accordingly, the terms should be defined on the basis of contents throughout the specification.

Figure 2:
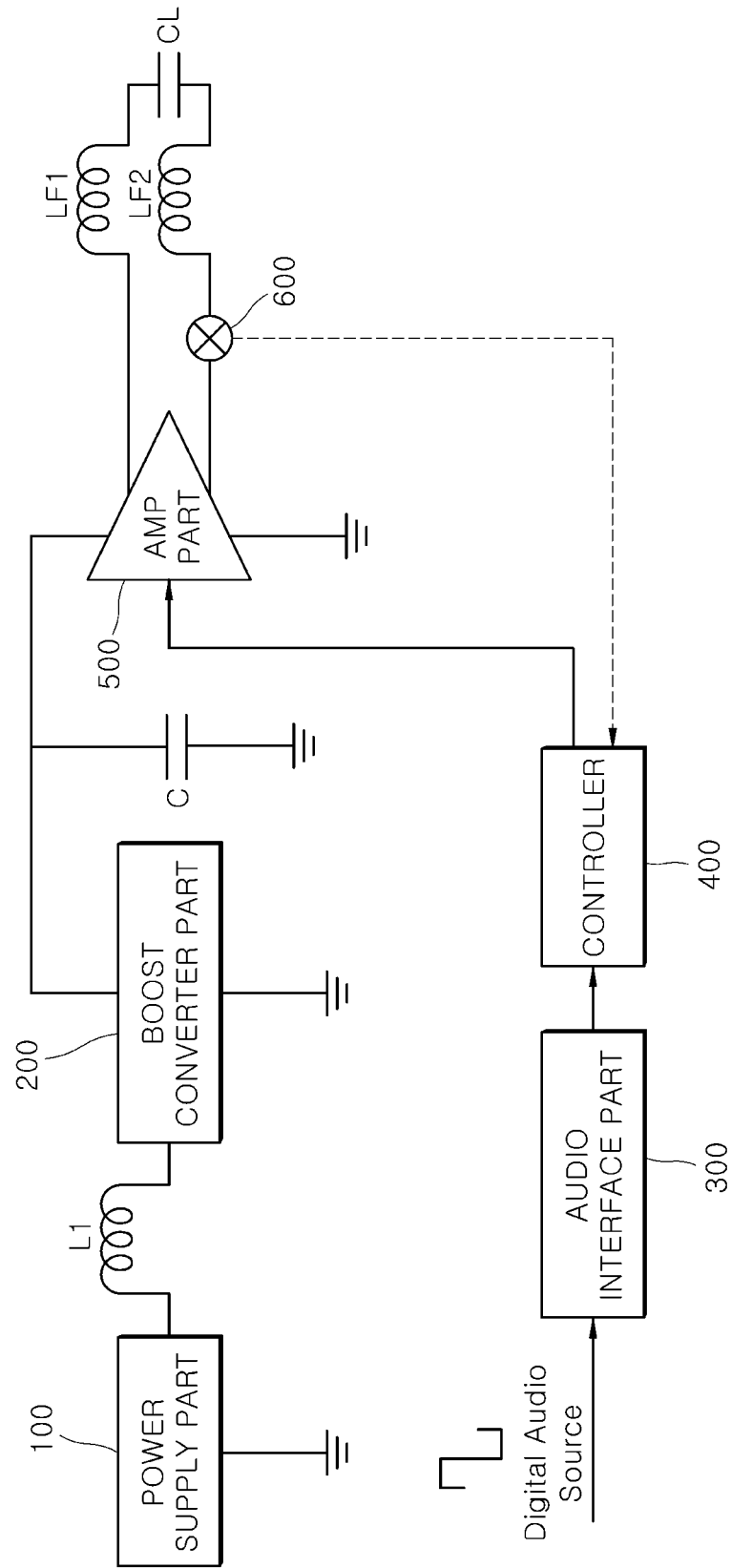
Figure 3:
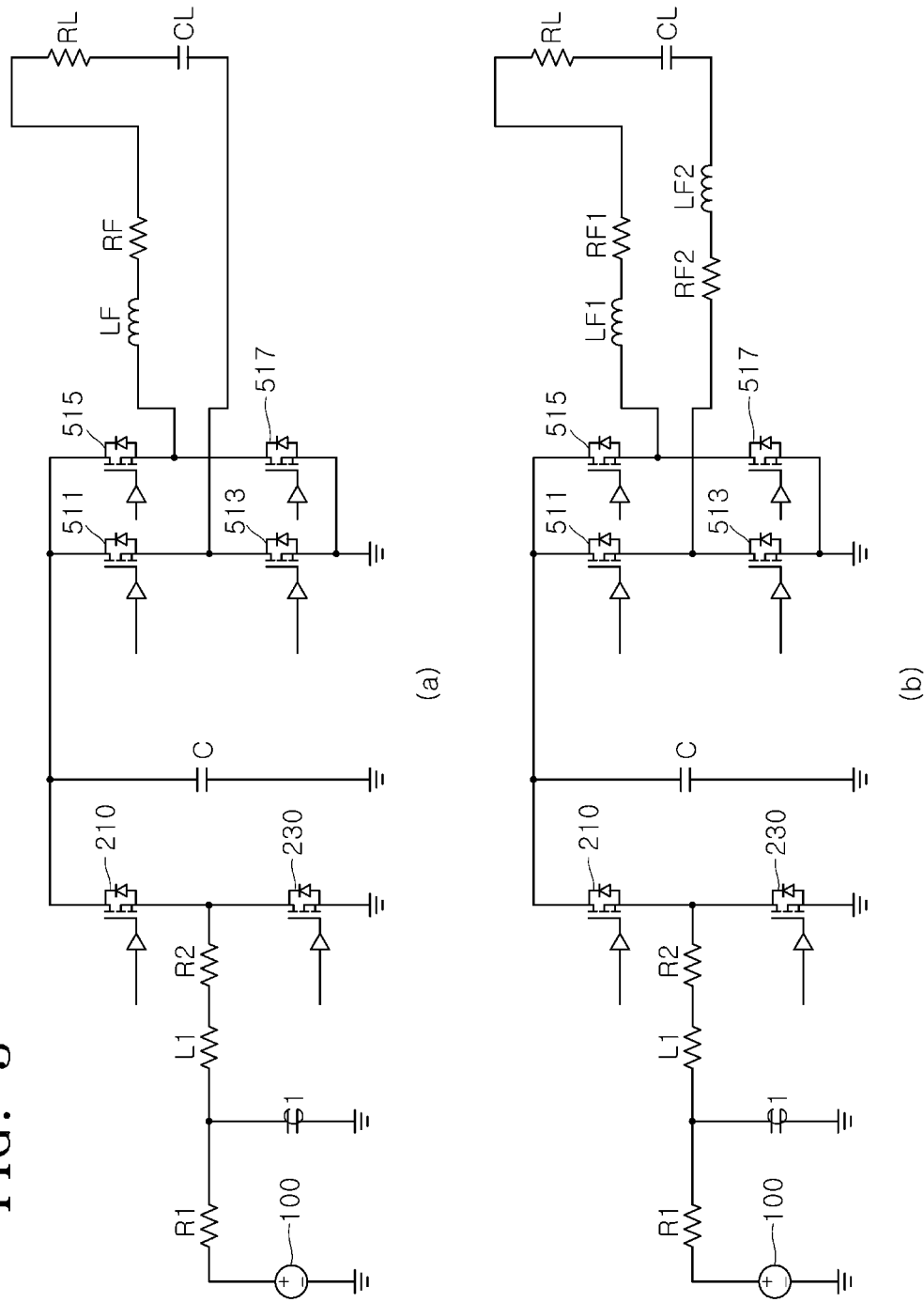
FIG. 3 is an exemplary view illustrating a circuit configuration in which a power supply part, a boost converter part, a capacitor, an amp part, an inductive element, and a capacitive speaker are connected in the speaker driver according to one embodiment of the present invention.
Figure 4:
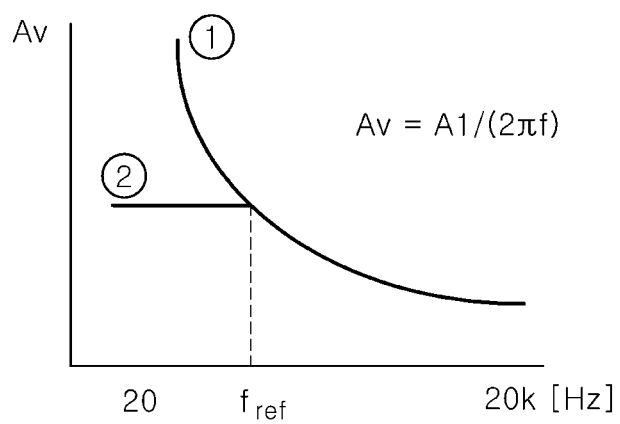
FIG. 4 is an exemplary view for describing a method of attenuating the magnitude of an input audio signal in a high frequency range in the speaker driver according to one embodiment of the present invention.

FIGS. 1 and 2 are exemplary views for describing an overall circuit configuration of a speaker driver according to one embodiment of the present invention, FIG. 3 is an exemplary view illustrating a circuit configuration in which a power supply part, a boost converter part, a capacitor, an amp part, an inductive element, and a capacitive speaker are connected in the speaker driver according to one embodiment of the present invention, FIG. 4 is an exemplary view for describing a method of attenuating the magnitude of an input audio signal in a high frequency range in the speaker driver according to one embodiment of the present invention, and FIGS. 5 to 9 are simulation results illustrating an effect in which the overcurrent may be removed in the speaker driver according to one embodiment of the present invention.

Referring to FIG. 1, the speaker driver according to one embodiment of the present invention may include a power supply part 100, a boost converter part 200, a capacitor C, an audio interface part 300, a controller 400, an amp part 500, and an inductive element LF, and may drive a capacitive speaker CL on the basis of the above-described configurations. In the embodiment, the capacitive speaker CL may be a piezo speaker configured to generate sound by a driving voltage, and accordingly, may be modeled as capacitive load in terms of a circuit. First, the configurations of the speaker driver according to the embodiment will be generally described with reference to FIG. 1.

The power supply part 100 may supply a power supply voltage to drive the speaker driver according to the embodiment and may be implemented as a battery configured to supply the power supply voltage in various apparatuses (for example: a mobile communication terminal such as a smart phone, a television, and the like) to which the speaker driver may be applicable. The power supply voltage of the power supply part 100 is boosted by the boost converter part 200, which will be described later, and stored in the capacitor C and then is transmitted to the amp part 500 which will be described later as a supply voltage.

The boost converter part 200 may output a current from the power supply part 100 to the capacitor C which will be described later so that the supply voltage in which the power supply voltage of the power supply part 100 is boosted may be formed in the capacitor C, and accordingly, the capacitor C may generate the supply voltage supplied to the amp part 500.

That is, as described above, the capacitive speaker CL in the embodiment may be implemented as the piezo speaker, and since a high driving voltage is required to drive the piezo speaker in comparison with a dynamic speaker, the boost converter part 200 may perform a function in which the power supply voltage of the power supply part 100 may be boosted and transmitted to the amp part 500. Meanwhile, the boost converter part 200 in the embodiment may be a synchronous boost converter having the shape of a half bridge and including first and second boost switches 210 and 230, and a detailed description will be described later.

The audio interface part 300 may receive an audio source signal and perform signal processing on the audio source signal to generate an input audio signal and transmit the input audio signal to the controller 400 which will be described later, and the controller 400 may process the received input audio signal and transmit the input audio signal to the amp part 500. Accordingly, the amp part 500 may output a pulse voltage, in which the input signal transmitted from the controller 400 is amplified on the basis of the supply voltage.

Here, terms will be clearly defined to easily grasp the embodiment. The audio source signal refers to a signal input to the audio interface part 300, the input audio signal refers to a signal transmitted from the audio interface part 300 to the controller 400, and the input signal refers to a signal transmitted from the controller 400 to the amp part 500. The power supply voltage refers to a voltage generated by the power supply part 100, the supply voltage refers to a voltage in which the power supply voltage is boosted by the boost converter part 200 and stored in the capacitor C and then is supplied to the amp part 500, the pulse voltage refers to a voltage output from the amp part 500, and the driving voltage refers to a voltage applied to the capacitive speaker CL.

On the basis of the above, hereinafter, an operation of the speaker driver according to the embodiment will be described in detail.

First, in descriptions of the amp part 500, the amp part 500 may output the pulse voltage, in which the input signal is amplified on the basis of the supply voltage, to drive the capacitive speaker CL that generates sound by the driving voltage so that the driving voltage formed by filtering the pulse voltage may be applied to the capacitive speaker CL.

Specifically, as described above, the power supply voltage of the power supply part 100 may be boosted by the boost converter part 200 and stored in the capacitor C, and the voltage stored in the capacitor C may be supplied to the amp part 500 as the supply voltage. On the basis of the supply voltage supplied from the capacitor C, the amp part 500 may amplify the input signal to generate and output the pulse voltage.

For the above-described operation, the amp part 500 may include a pulse width modulator configured to perform pulse width modulation on the input signal to generate a pulse width modulation signal and a switch part switched by the pulse width modulation signal to output the pulse voltage.

The pulse width modulator may generate the pulse width modulation signal by performing the pulse width modulation on the input signal through a comparator and a predesigned carrier signal, and the generated pulse width modulation signal is input to the switch part. As shown in FIG. 3A, the switch part may include first to fourth switches 511, 513, 515, and 517, and each of the switches may be implemented as a metal oxide semiconductor field effect transistor (MOSFET). Specifically, the switch part may include the first and third switches 511 and 515 of which drain terminals are connected to the capacitor C and receive the supply voltage, and the second and fourth switches 513 and 517 of which drain terminals are connected to source terminals of the first and third switches 511 and 515 and the source terminals are grounded. The pulse width modulation signal may be branched to first to fourth pulse width modulation signals through a predetermined gate driver including an inverter, and since the first to fourth pulse width modulation signals are respectively input to the first to fourth switches 511, 513, 515, and 517 and thus the first to fourth switches 511, 513, 515, and 517 are switched, the pulse voltage may be output. Since the inductive element LF which will be described later is connected to an output terminal of the amp part 500, an analog driving voltage formed by filtering the pulse voltage is applied to the capacitive speaker CL, and thus the capacitive speaker CL may be driven.

The amp part 500 may be implemented as a class-D amplifier, and accordingly, the energy efficiency may be improved in comparison with a case in which the capacitive speaker CL is driven through a class-AB amplifier.

Meanwhile, as described above, when the driving voltage having a high frequency is applied to the capacitive speaker CL, since impedance of the capacitive speaker CL decreases, currents which flow to the capacitive speaker CL suddenly increase. In order to limit an overcurrent which flows to the capacitive speaker CL, a method of inserting a serial resistor may be considered, but in this case, a great deal of heat is generated from the serial resistor by the overcurrent, and accordingly, power loss increases. Further, since a serial resistor having a large size is required to limit the overcurrent, miniaturization becomes difficult.

Since the frequency of the driving voltage applied to the capacitive speaker CL depends on a frequency of the input signal input to the amp part 500, in order to prevent application of the driving voltage having a high frequency to the capacitive speaker CL, prior signal processing for the input signal input from the controller 400 to the amp part 500 is required.

To this end, the controller 400 may adjust the magnitude of the input audio signal input from the audio interface part 300 in a high frequency range and transmit the input audio signal to the amp part 500 to limit the overcurrent applied to the capacitive speaker CL by the driving voltage having a high frequency.

That is, in the embodiment, not a configuration of inserting a physical serial resistance element into the output terminal of the amp part 500, but a configuration of limiting the overcurrent applied to the capacitive speaker CL by the driving voltage having a high frequency through only prior signal processing in the high frequency range for a signal to be input to the amp part 500 is adopted.

In this case, the controller 400 may perform signal processing on the input audio signal and attenuate the magnitude of the input audio signal in the high frequency range to generate the input signal to be input to the amp part 500. The high frequency range of the input audio signal of which the magnitude is attenuated refers to a high frequency range around an audible frequency band (for example: 10 kHz to 20 kHz). As method of attenuating the magnitude of the input audio signal in the high frequency range, various methods such as a low pass filter LPF, a high pass attenuator, or the like may be adopted. That is, the controller 400 may attenuate the magnitude of the input audio signal when the frequency of the input audio signal increases in all frequency bands as ① in FIG. 4, or may maintain the magnitude of the input audio signal in bands below a predesigned reference frequency (fref, fref is greater than 20 Hz and smaller than 20 kHz) and may attenuate the magnitude of the input audio signal when the frequency of the input audio signal increases in bands of the predesigned reference frequency or more as ② in FIG. 4. In FIG. 4, Av refers to a gain applied to the magnitude of the input audio signal, and A1 refers to a reference gain. The controller 400 may include a digital signal processor (DSP) to perform the above-described signal processing on the input audio signal.

Accordingly, since the input audio signal of which high frequency components are reduced is input to the amp part 500 as the input signal, and accordingly, high frequency components of each of the pulse voltage output from the amp part 500 and the driving voltage applied to the capacitive speaker CL are reduced, the overcurrent applied to the capacitive speaker CL may be limited.

Since the overcurrent which may flow to the capacitive speaker CL is prevented through only the above-described configuration, that is, the signal processing of the input audio signal, problems such as heat generation and power loss, and an increase in volume generated while using the serial resistor may be solved.

The inductive element LF may be connected between the amp part 500 and the capacitive speaker CL to form a low pass filter (LPF) configured to remove high frequency components except the audible frequency band together with the capacitive speaker CL, and the inductive element LF may be implemented as an inductor having a designed inductance value. Since the inductive element LF is connected to the output terminal of the amp part 500, the analog driving voltage formed by filtering the pulse voltage is applied to the capacitive speaker CL, and thus the capacitive speaker CL may be driven.

Further, the inductive element LF may perform a function of preventing a short current caused by the pulse voltage from the amp part 500 and the capacitive speaker CL. That is, since the short current which is greatly variable in an instant may be generated when connected to the capacitive load due to the characteristics of the class-D amplifier that outputs the pulse voltage through a switching operation of the switch, generation of the short current which is greatly variable in an instant may be prevented through the inductive element LF connected to the output terminal of the amp part 500.

Further, since the inductive element LF is connected between the amp part 500 and the capacitive speaker CL, power loss during a process of driving the capacitive speaker CL and a process in which the current is returned from the capacitive speaker CL (will be described later) may be minimized.

FIG. 1 illustrates a configuration in which the inductive element LF is connected to only a front end of the capacitive speaker, but according to the embodiment, as shown in FIG. 2, inductive elements LF1 and LF2 may be implemented as configurations respectively connected to a front end and a rear end of the capacitive speaker, and in FIGS. 1 and 2, circuit functions of the inductive elements LF, LF1, and LF2 are the same.

Meanwhile, as modeled and shown in FIG. 3A, inner resistors RF and RL are present in the inductive element LF and the capacitive speaker CL, and a current increase due to LC resonance caused by the inductive element LF and the capacitive speaker CL may be prevented through the inner resistors RF and RL and turn-on resistors of the first to fourth switches 511, 513, 515, and 517 of the amp part 500. In this case, with respect to FIG. 3A, a circuit design manner may be applied in which a Q-factor for a circuit at a right side of the output terminal of the amp part 500 is designed and a resistance value required to implement the designed Q-Factor is grasped to design the inductive element LF and the first to fourth switches 511, 513, 515, and 517. FIG. 3B illustrates modeling to the inner resistor RF2 of an inductive element LF2 in the circuit configuration in FIG. 2, and circuit functions thereof are the same as those in FIG. 3A.

FIGS. 5 to 9 are simulation results illustrating an effect in which the overcurrent may be removed through the speaker driver according to the embodiment.

Figure 5:
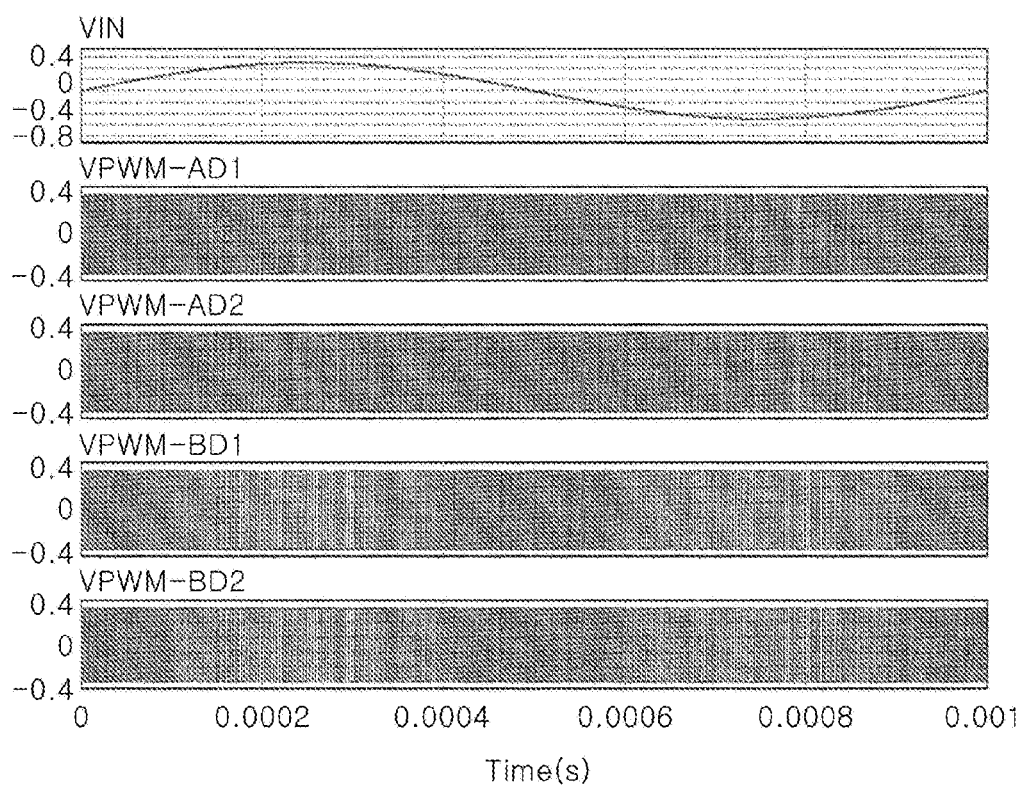
FIGS. 5 to 9 are simulation results illustrating an effect in which the overcurrent may be removed in the speaker driver according to one embodiment of the present invention.
Figure 6:
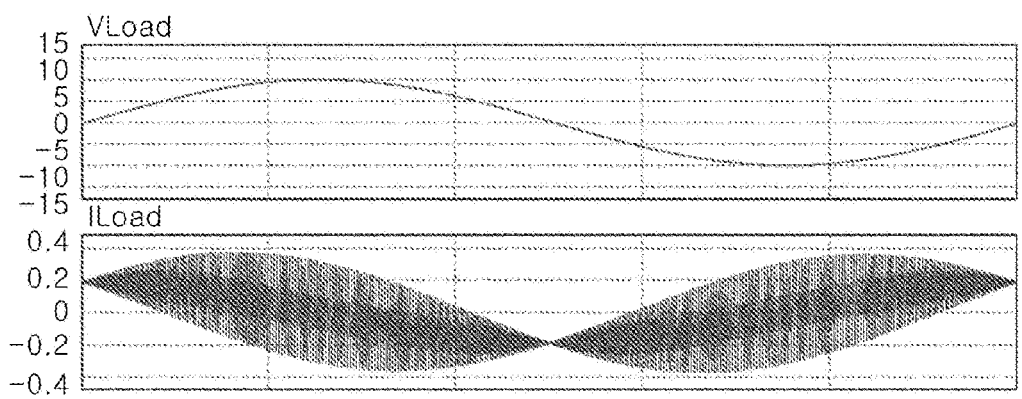
Figure 7:
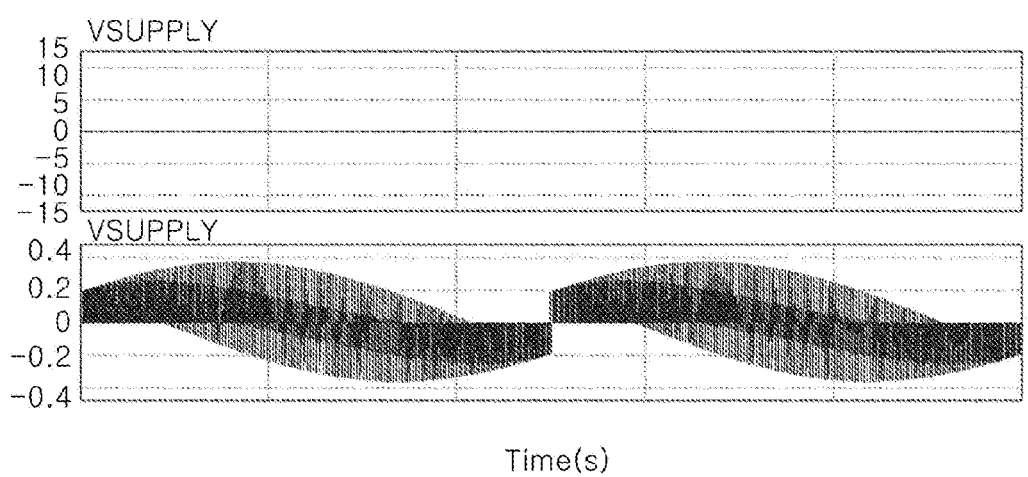

FIGS. 5 and 6 illustrate simulation results of the driving voltage and the current of the capacitive speaker CL in a case in which the input audio signal does not have high frequency components. VIN in FIG. 5 is an input audio signal having a frequency of 1 kHz, and VPWM_AD1, VPWM_AD2, VPWM_BD1, and VPWM_BD2 are simulation waveforms of the first to fourth pulse width modulation signals, respectively. FIG. 6 illustrates the simulation result according to input in FIG. 5, and in FIG. 6, VLoad is a driving voltage of the capacitive speaker CL, and ILoad is a current which flows to the capacitive speaker CL.

Figure 8:
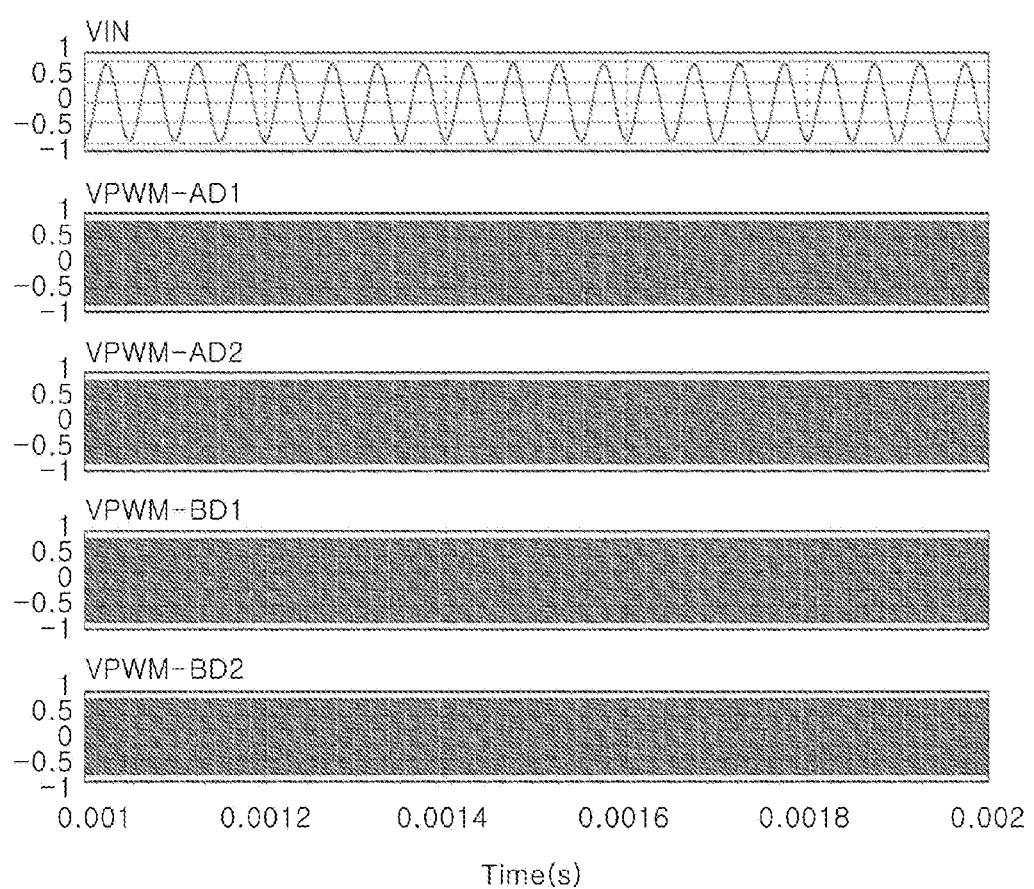
Figure 9:
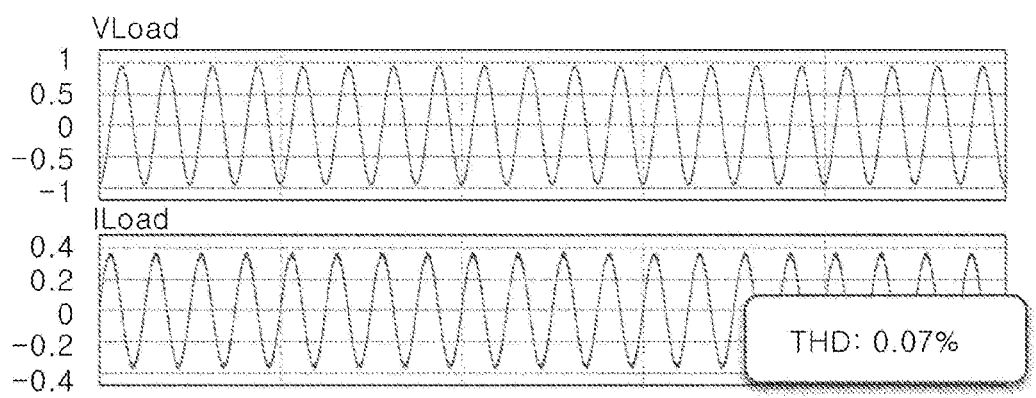

FIGS. 8 and 9 illustrate simulation results of the driving voltage and the current of the capacitive speaker CL in a case in which the input audio signal has high frequency components. VIN in FIG. 8 is an input audio signal having a frequency of 20 kHz, and VPWM_AD1, VPWM_AD2, VPWM_BD1, and VPWM_BD2 are simulation waveforms of the first to fourth pulse width modulation signals, respectively. FIG. 9 illustrates the simulation result according to input in FIG. 8, and in FIG. 9, VLoad is a driving voltage of the capacitive speaker CL, and ILoad is a current which flows to the capacitive speaker CL. A magnitude (peak to peak) of ILoad in FIG. 9 may be checked to be similar to a magnitude (peak to peak) of ILoad in FIG. 6, and total harmonic distortion (THD) is checked to be roughly 0.07%. The results show that a magnitude of the driving voltage applied to the capacitive speaker CL is reduced through signal processing of attenuating the magnitude of the input audio signal having a high frequency, and accordingly, the overcurrent due to an impedance increase of the capacitive speaker CL caused by the high frequency may be limited when the input audio signal having a high frequency is input to the controller 400

Further, in detailed descriptions of the boost converter part 200, as described above, the boost converter part 200 may output the current from the power supply part 100 to the capacitor C so that the supply voltage in which the power supply voltage of the power supply part 100 is boosted may be formed in the capacitor C. The boost converter part 200 may include the first and second boost switches 210 and 230, and the first and second boost switches 210 and 230 may be implemented as MOSFETs.

As shown in FIG. 3A, a drain terminal of the first boost switch 210, one terminal of the capacitor C, and a node from which the supply voltage is supplied to the amp part 500 are commonly connected, and a source terminal of the first boost switch 210 is connected to the power supply part 100. A drain terminal of the second boost switch 230 is connected to the source terminal of the first boost switch 210, and a source terminal of the second boost switch 230 is grounded. A smoothing capacitor C1 and an inductor L1 for a boost converter may be connected to nodes connected from the power supply part 100 to connection nodes of the first and second boost switches 210 and 230, and in FIG. 3A, modeling of a line resistor R1 and an inner resistor R2 of the inductor L1 for a boost converter is shown.

On the basis of the circuit configuration, the first boost switch 210 may be switched to output the current from the power supply part 100 to the capacitor C or return the current from the capacitor C to the power supply part 100 (that is, may be turned on or turned off), and the second boost switch 230 may excite the current from the power supply part 100 to ground, and in this case, the first boost switch 210 and the second boost switch 230 may be complementarily switched. A switching operation of each of the first and second boost switches 210 and 230 may be controlled by a control signal input from the controller 400 or an upper control device. Accordingly, the boost converter part 200 in the embodiment may be implemented as the synchronous boost converter having the shape of a half bridge and including the first and second boost switches 210 and 230.

When describing technical features in which the boost converter part 200 is implemented as the half bridge-shaped synchronous boost converter in more detail, in a case of the class-AB amplifier, all voltages accumulated in the capacitive speaker CL during the process of driving the capacitive speaker CL are consumed as heat in a switch of the class-AB amplifier. However, as described above, the amp part 500 in the embodiment may be implemented as the class-D amplifier, and since a process in which the current from the capacitor C is applied to the capacitive speaker CL through a switch of the class-D amplifier (for example: the second and third switches 513 and 515 are turned on, and the first and fourth switches 511 and 517 are turned off (a voltage of the capacitive speaker CL is smaller than or equal to a voltage of the capacitor C)) in the process of driving the capacitive speaker CL and a process in which the current from the capacitive speaker CL is introduced into the capacitor C through the switch of the class-D amplifier (for example: all the first to fourth switches 511, 513, 515, and 517 are turned off (the voltage of the capacitive speaker CL is greater than or equal to the voltage of the capacitor C)) are repeated, the capacitive speaker CL is driven.

In this case, when the current from the power supply part 100 is unidirectionally output to the capacitor C through the boost converter part 200, the voltage of the capacitor C increases without limit and thus burn out of the speaker driver may be caused, and an increase of the voltage of the capacitor C may further increase in the case in which the voltage of the capacitive speaker CL is greater than or equal to the voltage of the capacitor C. Accordingly, the boost converter part 200 in the embodiment may output the current from the power supply part 100 to the capacitor C and may include the first boost switch 210 so that the current from the capacitor C may be returned to the power supply part 100 to limit the increase of the voltage of the capacitor C when the voltage of the capacitor C increases to a predetermined level or more. That is, the first boost switch 210 allows a bidirectional flow of the current between the power supply part 100 and the capacitor C. In an example of simulations according to FIGS. 5 to 7, a case in which ILoad (the current which flows to the capacitive speaker CL) in FIG. 6 has a positive value and a negative value refers to a case in which the current is introduced into and withdrawn from the capacitive speaker CL, and a case in which the ISupply (the current which flows to the power supply part 100) in FIG. 7 has a positive value and a negative value refers to a case in which the current may bidirectionally flow between the power supply part 100 and the capacitor C.

Further, since the boost converter part 200 is implemented in the shape of a half bridge including the first and second boost switches 210 and 230, it may be controlled so that a switching frequency to the first and second boost switches 210 and 230 may not be present in the audible frequency band, and accordingly, a switching noise due to the switching operation of each of the first and second boost switches 210 and 230 may be reduced.

In addition, in detailed descriptions of the audio interface part 300, the audio interface part 300 may receive the audio source signal and perform signal processing on the audio source signal to generate the input audio signal and transmit the input audio signal to the controller 400. In this case, the audio interface part 300 may receive the audio source signal as a digital signal (that is, the audio interface part 300 may receive a digital audio source signal), and to this end, the embodiment may further include an analog-digital converter (ADC) configured to convert a first analog audio source signal to the digital audio source signal.

Specifically, as described above, the embodiment adopts the class-D amplifier as the amp part 500 and the half bridge-shaped synchronous boost converter as the boost converter part 200. Accordingly, the switching noise caused by the switching operation characteristics of each of the class-D amplifier and the half bridge boost converter may be applied to the audio source signal, and when the audio source signal is input as an analog signal shape, quality of sound output through the speaker may be degraded due to the characteristics of the analog signal vulnerable to a noise.

Accordingly, the audio interface part 300 in the embodiment may receive the audio source signal as a digital signal robust to the noise to prevent application of the switching noise caused by a switching operation of the amp part 500 and a switching operation of the boost converter part 200 to the audio source signal (that is, the audio interface part 300 may receive the digital audio source signal). According to the boost converter part 200, since the boost converter part 200 is implemented as the half bridge-shaped boost converter, it may be controlled so that the switching frequency to the first and second boost switches 210 and 230 may not be present in the audible frequency band, and the switching noise due to the switching operation of the boost converter part 200 may be doubly reduced through a configuration in which the audio source signal is input as the digital signal robust to the noise.

The audio interface part 300 may perform digital signal processing on a digital audio source signal according to an integrated interchip sound (I2S) or a time division multiplex (TDM) to generate an input audio signal having a pulse code modulation (PCM) data shape and then transmit the input audio signal to the controller 400.

Accordingly, the controller 400 may receive a PCM data-shaped digital input audio signal from an audio interface and perform digital signal processing which attenuates the magnitude of the PCM data-shaped digital input audio signal in the high frequency range to form the digital input signal to be input to the amp part 500, and the amp part 500 may amplify the digital input signal to output the pulse voltage. To this end, the amp part 500 may be implemented as a full digital class-D amplifier, and the pulse width modulator of the amp part 500 may be implemented as a PCM-pulse width modulation (PWM) converter. Accordingly, in the embodiment, since all signals generated during the process in which the pulse voltage is output from the audio source signal are digital signals, influence of the switching noise due to a switching operation of each of the class-D amplifier and the half bridge boost converter may be effectively reduced even when the class-D amplifier and the half bridge boost converter are adopted.

Meanwhile, as shown in FIG. 1, the embodiment may further include a current detection part 600 configured to detect the current which flows to the capacitive speaker CL, and accordingly, the controller 400 may determine a change in impedance of the capacitive speaker CL on the basis of the current detected by the current detection part 600 and may adjust the magnitude of the input audio signal or determine whether the capacitive speaker CL is burned out on the basis of a determination result.

Specifically, when the controller 400 is an upper control device configured to control an operation of the speaker driver in the embodiment, the supply voltage generated by the boost converter part 200 and the capacitor C, the pulse voltage output from the amp part 500, and the driving voltage applied to the capacitive speaker CL may be grasped, and accordingly, impedance Z of the capacitive speaker CL may be gained by detecting a current I which flows to the capacitive speaker CL through the current detection part 600 and calculating the current I with the driving voltage V (that is, $|Z|=|V|/|I|$). According to the embodiment, the controller 400 may grasp the driving voltage applied to the capacitive speaker CL through a voltage detection part configured to directly detect the driving voltage applied to the capacitive speaker CL.

Accordingly, the controller 400 may monitor the impedance of the capacitive speaker CL to determine the change, and since the magnitude of the input audio signal is adjusted by the change in the impedance, the capacitive speaker CL may be controlled to be actively driven according to the present detected impedance. A specific manner in which the magnitude of the input audio signal is adjusted according to the change in the impedance may be variously designed on the basis of intentions of a designer and experimental results. Further, the controller 400 may determine that the capacitive speaker CL is burned out when the present detected impedance of the capacitive speaker CL is out of a predetermined expected range in consideration of a value of the impedance of the capacitive speaker CL in a normal state.

FIG. 10 is a flow chart illustrating an operation method of the speaker driver according to one embodiment of the present invention In descriptions of an operation method of the speaker driver according to one embodiment of the present invention with reference to FIG. 10, first, the audio interface part 300 receives the audio source signal and performs signal processing on the audio source signal to generate the input audio signal and transmit the input audio signal to the controller 400 (S100).

In operation S100, the audio interface part 300 receives the audio source signal as the digital signal to prevent the application of the switching noise caused by the switching operation of the amp part 500 and the switching operation of the boost converter part 200 to the audio source signal.

Next, the controller 400 adjusts the magnitude of the input audio signal in the high frequency range and generates the input signal to be input to the amp part 500 to limit the overcurrent applied to the capacitive speaker CL (S200).

In operation S200, the controller 400 performs signal processing on the input audio signal and attenuates the magnitude of the input audio signal in the high frequency range to generate the input signal to be input to the amp part 500

Meanwhile, the boost converter part 200 may output the current from the power supply part 100 to the capacitor C so that the supply voltage in which the power supply voltage of the power supply part 100 is boosted and supplied to the amp part 500 may be formed in the capacitor C (S300). As described above, the boost converter part 200 in the embodiment may be implemented as the synchronous boost converter including the first and second boost switches 210 and 230 which operate complementarily.

Operation S300 is configured to be performed in parallel with operation S100 and operation S200, and a time-series operation order is not limited to the above-described order.

After operation S100 to operation S300 are performed, the amp part 500 outputs the pulse voltage, in which the input signal is amplified on the basis of the supply voltage, to drive the capacitive speaker CL so that the driving voltage formed by filtering the pulse voltage is applied to the capacitive speaker CL (S400). Since the inductive element LF forming the low pass filter (LPF) together with the capacitive speaker CL is connected to the output terminal of the amp part 500, the analog driving voltage formed by filtering the pulse voltage is applied to the capacitive speaker CL and thus the capacitive speaker CL may be driven. The inductive element LF may perform the function of preventing the short current caused by the pulse voltage from the amp part 500 and the capacitive speaker CL. Further, since the inductive element LF is connected between the amp part 500 and the capacitive speaker CL, power loss during a process in which the current is introduced into the capacitive speaker CL and a process in which the current is returned from the capacitive speaker CL may be minimized Through operation S100 to operation S400, since the input audio signal having reduced high frequency components is input to the amp part 500 as the input signal, and accordingly, the high frequency components of each of the pulse voltage output from the amp part 500 and the driving voltage applied to the capacitive speaker CL are reduced, the overcurrent applied to the capacitive speaker CL may be limited.

Meanwhile, as shown in FIG. 10, the embodiment may further include operations S500 to S700.

Specifically, the current detection part 600 detects current which flows to the capacitive speaker CL in a process in which the capacitive speaker CL is driven (S500).

Next, the controller 400 determines the change in the impedance of the capacitive speaker CL on the basis of the current detected by the current detection part 600 (S600).

Subsequently, the controller 400 adjusts the magnitude of the input audio signal or determines whether the capacitive speaker CL is burned out on the basis of the determination result of the change in the impedance in operation S600 (S700).

Effects of the above-described embodiment will be described later.

In the embodiment, since the overcurrent generated when the piezo speaker is driven at a high frequency is limited not through a method of using the serial resistor, but only through signal processing in which the magnitude of the input audio signal in the high frequency range is attenuated, problems in a conventional speaker driver such as heat generation, power loss, and volume problems may be removed. Further, since not the class-AB amplifier used to drive a conventional piezo speaker but the class-D amplifier is adopted, power loss may be reduced and energy efficiency may be improved.

Since the inductive element LF, that is, the inductor, is connected between the class-D amplifier and the piezo speaker, the analog driving voltage may be applied to the piezo speaker from the pulse voltage output from the class-D amplifier. Further, generation of the short current which may be generated when the class-D amplifier and a piezo element are directly connected may be prevented by the inductive element LF. In addition, the power loss which occurs during the process in which the current is introduced into the capacitive speaker CL through the inductive element LF and the process in which the current is returned from the capacitive speaker CL may be minimized In the embodiment, since a configuration configured to drive the piezo speaker through the class-D amplifier is adopted, the current is introduced into and leaks from the piezo speaker to drive the piezo speaker, and the current which leaks from the piezo speaker is accumulated in the capacitor C. In this case, when the current from the power supply part 100 is unidirectionally output to the capacitor C through the boost converter part 200, the voltage of the capacitor C increases without limit. Accordingly, in the embodiment, the synchronous boost converter including the first boost switch 210 may be adopted to allow the current to bidirectionally flow between the power supply part 100 and the capacitor C so that the current from the capacitor C may be returned to the power supply part 100. Further, since the boost converter part 200 is implemented in the shape of a half bridge including first and second boost switches 210 and 230, the boost converter part 200 may be controlled so that the switching frequency to the first and second boost switches 210 and 230 may not be present in the audible frequency band, and accordingly, the switching noise due to the switching operation of each of the first and second boost switches 210 and 230 may be reduced.

Since the switching noise caused by the switching operation characteristic of each of the class-D amplifier and the half bridge boost converter may be applied to the audio source signal, in the embodiment, the audio source signal may be input to the noise as the robust digital signal, and thus the switching noise may be efficiently reduced.

Since the magnitude of the input audio signal is adjusted by the change in the impedance of the piezo speaker, the piezo speaker may be more actively driven, and since whether the piezo speaker is burned out is determined in a process of driving the piezo speaker, maintenance of the piezo speaker may be facilitated.

As described above, the present invention is described with reference to the embodiment shown in the drawings, the above descriptions are only exemplary embodiments, and various modifications and other equivalents may be performed by those skilled in the art. Accordingly, the technical scope of the present invention should be determined by claims which will be described later.

The invention claimed is:

1. A speaker driver comprising:
    an amp part configured to output a pulse voltage, in which an input signal is amplified on the basis of a supply voltage, to drive a capacitive speaker that generates sound by a driving voltage so that the driving voltage formed by filtering the pulse voltage is applied to the capacitive speaker; and a controller configured to adjust a magnitude of an input audio signal in a high frequency range and transmit the input audio signal to the amp part as the input signal to limit an overcurrent applied to the capacitive speaker by the driving voltage having a high frequency, wherein the amp part is a class-D amplifier including a pulse width modulator configured to perform pulse width modulation on the input signal to generate a pulse width modulation signal, and a switch part switched by the pulse width modulation signal to output the pulse voltage, wherein the speaker driver further comprises:
a capacitor configured to generate the supply voltage supplied to the amp part; and
a boost converter part configured to output a current from a power supply part to the capacitor so that the supply voltage in which a power supply voltage of the power supply part is boosted is formed in the capacitor, wherein a process in which the current from the capacitor flows into the capacitive speaker through the amp part, and a process in which the current from the capacitive speaker flows into the capacitor through the amp part are repeated to drive the capacitive speaker, and wherein the boost converter part is implemented as a synchronous boost converter including a first boost switch switched to output the current from the power supply part to the capacitor or return the current from the capacitor to the power supply part, and a second boost switch which excites the current from the power supply part to ground and is complementarily switched with the first boost switch, so that the voltage of the capacitor can be limited to increase above a certain value.

2. The speaker driver of claim 1, wherein the controller performs signal processing on the input audio signal and attenuates the magnitude of the input audio signal in the high frequency range.

3. The speaker driver of claim 1, further comprising an inductive element connected between the amp part and the capacitive speaker to form a low pass filter (LPF) together with the capacitive speaker and prevent a short current caused by the pulse voltage and the capacitive speaker.

4. The speaker driver of claim 1, further comprising an audio interface part configured to receive an audio source signal and perform signal processing on the audio source signal to generate the input audio signal and transmit the input audio signal to the controller,
wherein the audio interface part receives the audio source signal as a digital signal to prevent application of a switching noise caused by a switching operation of the amp part and a switching operation of the boost converter part to the audio source signal.

5. The speaker driver of claim 1, further comprising a current detection part configured to detect a current which flows to the capacitive speaker,
wherein the controller determines a change in impedance of the capacitive speaker on the basis of the current detected by the current detection part and adjusts the magnitude of the input audio signal or determines whether the capacitive speaker is burned out on the basis of a determination result.

6. The speaker driver of claim 1, wherein the capacitive speaker is a piezo speaker.

7. An operation method of a speaker driver, comprising:
adjusting, by a controller, a magnitude of an input audio signal in a high frequency range and generating an input signal to be input to an amp part to limit an overcurrent applied to a capacitive speaker configured to generate sound by a driving voltage; and
outputting, by the amp part, a pulse voltage in which the input signal is amplified on the basis of a supply voltage to drive the capacitive speaker and applying the driving voltage formed by filtering the pulse voltage to the capacitive speaker,
wherein, in the applying operation, the amp part performs pulse width modulation on the input signal through a pulse width modulator to generate a pulse width modulation signal and outputs the pulse voltage through a switch part switched by the pulse width modulation signal,
wherein the operation method further comprises outputting, by a boost converter part, a current from a power supply part to a capacitor so that the supply voltage in which a power supply voltage of the power supply part is boosted is formed in the capacitor,
wherein, in the applying operation, the amp part receives the supply voltage from the capacitor,
wherein a process in which the current from the capacitor flows into the capacitive speaker through the amp part, and a process in which the current from the capacitive speaker flows into the capacitor through the amp part are repeated to drive the capacitive speaker, and
wherein the boost converter part is implemented as a synchronous boost converter including a first boost switch switched to output the current from the power supply part to the capacitor or return the current from the capacitor to the power supply part, and a second boost switch which excites the current from the power supply part to ground and is complementarily switched with the first boost switch, so that the voltage of the capacitor can be limited to increase above a certain value.

8. The operation method of claim 7, wherein, in the generating operation, the controller performs signal processing on the input audio signal and attenuates the magnitude of the input audio signal in the high frequency range to generate the input signal.

9. The operation method of claim 7, wherein the speaker driver further includes an inductive element connected between the amp part and the capacitive speaker to form a low pass filter (LPF) together with the capacitive speaker and prevent a short current caused by the pulse voltage and the capacitive speaker.

10. The operation method of claim 7, further comprising receiving an audio source signal and performing signal processing on the audio source signal, by an audio interface part, an audio source signal to generate the input audio signal and transmit the input audio signal to the controller,
wherein the audio interface part receives the audio source signal as a digital signal to prevent application of a switching noise caused by a switching operation of the amp part and a switching operation of the boost converter part to the audio source signal.

11. The operation method of claim 7, further comprising:
detecting, by a current detection part, a current which flows to the capacitive speaker;
determining, by the controller, a change in impedance of the capacitive speaker on the basis of the current detected by the current detection part; and adjusting the magnitude of the input audio signal or determining whether the capacitive speaker is burned out, by the controller, on the basis of a determination result of the change in the impedance.

12. The operation method of claim 7, wherein the capacitive speaker is a piezo speaker.

* * * * *